US012560634B2

(12) United States Patent
Kuhn et al.

(10) Patent No.: US 12,560,634 B2
(45) Date of Patent: Feb. 24, 2026

(54) SIGNAL PROCESSING CIRCUIT AND MEASUREMENT SYSTEM

(71) Applicant: Rohde & Schwarz GmbH & Co. KG, Munich (DE)

(72) Inventors: Christian Kuhn, Munich (DE); Matthias Ruengeler, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 156 days.

(21) Appl. No.: 18/498,470

(22) Filed: Oct. 31, 2023

(65) Prior Publication Data

US 2025/0138072 A1     May 1, 2025

(51) Int. Cl.
*G01R 27/32* (2006.01)
*G01R 31/28* (2006.01)
*H03D 7/16* (2006.01)

(52) U.S. Cl.
CPC ......... *G01R 27/32* (2013.01); *G01R 31/2824* (2013.01); *G01R 31/2837* (2013.01); *H03D 7/165* (2013.01)

(58) Field of Classification Search
CPC ......... G01R 27/32; G01R 31/28; G01R 23/16
See application file for complete search history.

(56) References Cited

U.S. PATENT DOCUMENTS 9,491,646 B2 * 11/2016 Franke ............... G01R 13/0236
9,678,123 B2 * 6/2017 Dunsmore .......... G01R 23/163
9,967,085 B1 5/2018 Bradley
(Continued)

FOREIGN PATENT DOCUMENTS

CN 109995387 B 3/2021
JP H08233875 A 9/1996
KR 20080068595 * 7/2008 ........... H04B 1/1027

OTHER PUBLICATIONS

Zhang, Y. et al., "Precisely Synchronized NVNA Setup for Digitally Modulated Signal Generation and Measurement at 5G-Oriented Millimeter-Wave Test Bands," IEEE Transactions on Microwave Theory and Techniques, vol. 69, No. 1, Jan. 2021, pp. 833-845.
(Continued)

*Primary Examiner* — Neel D Shah

(74) *Attorney, Agent, or Firm* — CHRISTENSEN O'CONNOR JOHNSON KINDNESS PLLC

(57) ABSTRACT

A measurement system includes a narrowband receiver configured to receive an input signal with an initial bandwidth. The narrowband receiver includes at least one local oscillator configured to provide a local oscillator signal having a center frequency and at least one signal mixer configured to mix the input signal and the local oscillator signal to obtain a mixed signal including image portions. The mixed signal has a respective center frequency in view of the local oscillator signal mixed therein. The narrowband receiver is configured to process two or more mixed signals, thereby obtaining two or more captured signals for different center frequencies of the local oscillator signal. The two or more captured signals have a limited bandwidth compared to the initial bandwidth. The narrowband receiver is configured to combine the two or more captured signals in order to obtain a processed signal without image portions.

19 Claims, 5 Drawing Sheets

(56) References Cited

U.S. PATENT DOCUMENTS

| | | |
|---|---|---|
| 10,003,419 B1 | 6/2018 | Verspecht et al. |
| 11,336,550 B2 | 5/2022 | Hirschmann et al. |
| 2006/0084426 A1 | 4/2006 | Anderson et al. |
| 2016/0337887 A1 | 11/2016 | Dunsmore et al. |
| 2020/0057100 A1 | 2/2020 | Ruengeler et al. |

OTHER PUBLICATIONS

Khatri, V. et al., "A 0.25-3.25-GHz Wideband CMOS-RF Spectrum Sensor for Narrow band Energy Detection," IEEE Transactions on Very Large Scale Integration (VLSI) Systems, vol. 24, No. 9, Sep. 2016, pp. 2887-2898.

* cited by examiner

$$
\begin{pmatrix}
R_{900} \\
L_{900} \\
R_{950} \\
L_{950} \\
R_{1000} \\
L_{1000} \\
R_{1050} \\
L_{1050} \\
R_{1100} \\
L_{1100}
\end{pmatrix}
=
\begin{pmatrix}
1.... \\
.1..... \\
.11....... \\
1..1.... \\
....11.... \\
...1..1... \\
.......11. \\
......1..1 \\
..........1 \\
.........1.
\end{pmatrix}
\times
\begin{pmatrix}
B1 \\
-B1 \\
B2 \\
-B2 \\
B3 \\
-B3 \\
B4 \\
-B4
\end{pmatrix}
$$

SIGNAL PROCESSING CIRCUIT AND MEASUREMENT SYSTEM

FIELD OF THE DISCLOSURE

The present disclosure generally relates to a measurement system and a method for eliminating image portions.

BACKGROUND

Mobile phones, tablets, and other user equipment (UE) devices or electronic components (such as power amplifiers), in general devices under test (DUTs), used for modern communication purposes are inter alia characterized in view of their frequency dependent transmission properties. For example, the properties of particular frequency bandwidths used for specific communication protocols, such as 5G, LTE, or 6G have to be investigated so as to characterize the respective DUTs in view of their respective transfer function, quality of the output signal (e.g., error vector magnitude) and/or their scattering parameters.

Therefore, the general aim is to precisely evaluate DUTs in view of the wideband bandwidths associated to the particular communication standards in question. Typically, vector network analyzers (VNAs) are used for the measurement of scattering parameters. Beyond this, it would be beneficial to overcome specific restrictions and to use VNAs also for measurements of the signal quality.

However, while the wideband bandwidths of the communication standards in question usually cover bandwidths of several hundred MHz, such as 320 MHz (WiFi), the bandwidths of VNAs for reliable characterization is limited to only a few tens MHz, such as 50 MHz. Hence, the wideband bandwidth of interest cannot be captured using a "single-shot measurement". Rather, several distinct measurement signals have to be acquired, where the respective VNA bandwidths are shifted with regard to each other employing different center frequencies such that separate measurement signals are obtained which together cover the entire wideband bandwidth in question. The wideband bandwidth in question can then be obtained by superposition of the individual narrow bandwidth detection signals.

However, due to the technical nature of the measurement principles, VNAs usually show image reception features. That means that despite the desired "true" signal portions relying on the exact measurement setup, image portions are captured as well which may be considered artifacts that falsify (or at least influence) the "true" measurement signal portions. The image portions are also known as spectral aliasing features. These image portions also influence the superposed (combined) signal being established from the multiple separate measurement signals in order to cover the entire wideband bandwidth. As a consequence, the image portions also affect the determination of the transfer function and/or the scattering parameters as well as an error vector magnitude (EVM) of the respective DUT.

One possible approach to circumvent this problem is to apply specialized VNAs having image compensation techniques, such as specialized receiver hardware comprising image rejection and wideband sampling. However, this equipment is cost-intensive thereby rendering high efforts for investigation procedures of DUTs with regard to their wideband bandwidth properties. For many applications, this approach is not wanted as to its commercial disadvantages.

Accordingly, there is a need for a measurement system and a method which enable the wideband properties of DUTs to be evaluated more efficiently, in particular, at high precision and low costs.

SUMMARY

A summary of certain embodiments disclosed herein is set forth below. It should be understood that these aspects are presented merely to provide a brief summary of these embodiments and that these aspects are not intended to limit the scope of this disclosure. This disclosure may encompass a variety of aspects that may not be set forth below. Some aspects as explained in view of methods, others in view of devices. However, the respective aspects are to be correspondingly transferred from methods to devices and vice versa.

Embodiments of the present disclosure relate to a measurement system for eliminating image portions. In an embodiment, the measurement system comprises a narrowband receiver. The narrowband receiver may comprise no intrinsic image rejection techniques. The narrowband receiver is configured to receive an input signal with an initial bandwidth. In an embodiment, the narrowband receiver comprises at least one local oscillator configured to provide a local oscillator signal having a center frequency and at least one signal mixer configured to mix the input signal and the local oscillator signal to obtain a mixed signal typically including image portions. The mixed signal has a respective center frequency in view of the local oscillator signal mixed therein.

In some embodiments, the narrowband receiver is configured to process two or more mixed signals, thereby obtaining two or more captured signals for different center frequencies of the local oscillator signal. The two or more captured signals each have a limited bandwidth compared to the initial bandwidth.

In some embodiments, the narrowband receiver is also configured to combine the two or more captured signals in order to obtain a processed signal without image portions.

The measurement system makes use of the idea to tailor the processing of the received input signal so as to avoid image portions within the processed signal finally obtained. In this regard, the processed signal is established by combining several individual captured signals. These signals are particularly achieved based on the applied mixing so as to have a specifically tailored center frequency and a limited bandwidth as compared to the initial bandwidth of the input signal. As to the limited bandwidth, only a certain portion of the image portions is included within the captured signals. A mapping procedure can then be determined to compensate for the image portions. As a consequence, image portions can be avoided within the processed captured signals and straightforwardly also within the processed signal. The resulting processed signal shows the full bandwidth compared to the individual narrowband captures. Therefore, the processing steps typically require digital up-sampling. This enables the entire bandwidth of interest to be inspected and evaluated so as to characterize any device which outputs the input signal received by the narrowband receiver. Moreover, as the processed signal does not show any image portions, it may be evaluated for determining signal related quantities therefrom, such as transfer function, error vector magnitude, and/or scattering parameters.

These advantages are achieved although the measurement system does not rely on a signal processing technology which per se provides image rejection techniques, such as provided by specialized vector network analyzers or classical spectrum analyzers having such functionality. Therefore, the measurement system may also be applied using more compact narrowband receivers without having any kind of (automated) image rejection techniques included therewith. Put differently, the narrowband receiver omit any intrinsic image rejection techniques, and may be regarded as a usual (non-specialized) vector network analyzer. Accordingly, the cost-efficiency provided by the measurement system as described hereinbefore is high. Furthermore, the measurement system does not cause any limitation of the achievable precision. Accordingly, evaluation of the processed signal can be performed at high precision.

In another aspect, some embodiments of the present disclosure relate to a method for eliminating image portions. In an embodiment, the method comprises at least the following steps. An input signal with an initial bandwidth is received by a narrowband receiver. The narrowband receiver is enabled to digitize the input signal only with a limited bandwidth. The narrowband receiver omits any intrinsic image rejection techniques.

In an embodiment, a local oscillator signal with a center frequency is provided by at least one local oscillator of the narrowband receiver. The input signal and the local oscillator signal are mixed by at least one mixer of the narrowband receiver to obtain a mixed signal including image portions. The mixed signal has a respective center frequency in view of the local oscillator signal mixed therein.

In an embodiment, two or more mixed signals are processed by the narrowband receiver, thereby obtaining two or more captured signals for different center frequencies of the local oscillator signal. The two or more captured signals have a limited bandwidth compared to the initial bandwidth.

In an embodiment, the two or more captured signals are combined in order to obtain a processed signal without image portions.

The technical advantages provided in view of the measurement system as described hereinbefore are readily achieved by the method as indicated herein as well. In particular, the method does not rely on specific vector network analyzers having image rejection (compensation) techniques. Rather, the image compensation is achieved based on an advantageous procedure of how the input signal received by the narrowband receiver is processed.

In some embodiments, The narrowband receiver may be a classical vector network-analyzer without intrinsic image portion compensating techniques.

In some embodiments, the initial bandwidth may be regarded as the full frequency-dependent bandwidth in view of the received input signals for which data may be detected by the narrowband receiver. Put differently, the initial bandwidth corresponds to the bandwidth of the signal inputted. Typically, the initial bandwidth of a narrowband receiver may be between 50 MHz and 100 MHz, such as 60 Hz to 70 MHz. The actual detection procedure applied by the narrowband receiver may further limit the detection bandwidth as compared to the initial bandwidth, such as by applying filters or other signal modifying components.

In some instances, there might exist local oscillator frequency settings without image portions. Therefore, the mixed signal provided by the signal mixer does not necessarily include image portions. However, typically the mixed signal includes image portions.

In some embodiments, the captured signals are gathered by applying a filter on the mixed signal, for instance a low-pass filter. The filter may have a two-sided bandwidth of about 100 to 150 MHz, for instance 125 MHz. The respective edges of the filter may be associated with plus/minus 37.5 to 62.5 MHz, for instance plus/minus 50 MHz. Applying the filter may cause the limited bandwidth compared to the initial bandwidth.

Generally, the center frequency of the local oscillator signal is adapted such that the different captured signals relate to different sections of the input signal, also called input signal portions. Moreover, the different captured signals are associated with different sections of the mixed signal.

In the respective captured signals, an input signal portion and an image portion may be encompassed. However, the captured signals also relate to different sections of the image signal. Hence, the image portions of the different captured signals relate to different sections of the image signal, also called image signal portions.

By combining the different captured signals, encompassing input signal portions and an image portions, the image rejection can be achieved.

In some embodiments, the narrowband receiver is configured to adapt the center frequency of the local oscillator signal such that an overlap between different captured signals is prevented. In other words, the different captured signals may relate to adjacent sections of the input signal or the mixed signal, namely without any overlap, e.g. adjacent input signal portions. The adjacent input signal portions may be directly adjacent. Hence, they may merge into each other. This applies in a similar manner for the image signal, namely the image signal portions. Therefore, the combination procedure for achieving the processed signal is simplified as no overlapping signal portions have to be considered. Moreover, the number of required captured signals can be minimized by choosing appropriate center frequencies such that the efficiency of the underlying signal processing procedure is optimized.

In other embodiments, the narrowband receiver is configured to adapt the center frequency of the local oscillator signal such that an overlap between different captured signals is established. Put differently, some spectral overlap might be applied for consecutive segments to use advanced combination techniques for obtaining the recovered signal with full bandwidth and compensated image. By establishing an overlap, the quality of the reconstructed image compensated signal can be enhanced. For example, with regard to the overlapping portions averaging techniques may be applied such that artifacts can be compensated.

The overlap between different captured signals could be small. The overlap is regarded "small" when being smaller or much smaller (i.e. smaller by a factor of 10 or more) than the bandwidth of the individual captured signals. In doing so, advanced signal-processing techniques may be applied for improving the signal quality in view of the overlap. As a result, a recombined signal, i.e. the processed signal, is achieved without having multiple summed contributions in view of the overlap. Put differently, the influence of the overlap on the processed signal can be compensated for by applying the advanced signal-processing techniques.

According to yet other embodiments, the narrowband receiver is configured to adapt the center frequency of the local oscillator signal such that gaps are provided between different captured signals. Then the processed signal can be established with fewer captured signals. Optionally, signal portions corresponding to the gap bandwidths can be artificially recovered based on extrapolating procedures taking adjacent captured signals into account.

Consequently, the measurement system and the method are not limited to non-overlapping captured signals. Rather, advanced combination techniques using elements like over-lap-filters, numerically controlled oscillators, and up-samplers might be used to optimize the quality of the processed signal based on the input signal having only the initial bandwidth.

In some embodiments, the captured signals are offset with respect to each other based on the respectively associated center frequencies of the local oscillator signal. Put differently, the center frequencies establish a respective offsetting scheme such that the entire bandwidth of interest may be covered by a minimized number of captured signals. Accordingly, the efficiency of the measurement system is high.

Optionally, the narrowband receiver comprises a coupler configured to split an a-wave signal propagating in a first direction and a b-wave signal propagating in a second direction, e.g. forward propagating waves and backward propagating waves. The second direction is opposite to the first direction. Therefore, the processed signal can be evaluated in view of different scattering parameters describing opposite propagation directions, such as a forward propagating direction and a backward propagation direction (reflected wave).

In some embodiments, the narrowband receiver is configured to determine at least one scattering parameter associated with the processed signal. Thus, devices which influence the input signal received by the narrowband receiver can be precisely characterized.

The scattering parameter may for example relate to reverse gain and forward gain, such as S12 or S21. Also, the error vector magnitude (EVM) may be evaluated. In this regard, the EVM can be measured with a calibrated measurement system. In this case, the signal to be measured can be from a DUT and is not required to originate from a signal generator. In some embodiments, a calibration procedure is needed in view of the measurement system, such as typical VNA calibration techniques. For example, this can be achieved with a synchronized signal generator, or a synchronized DUT. From this, calibration parameters can be determined and any synchronized wideband signal can be measured. These procedures can be applied in view of evaluation procedures of any of S-parameters, EVM, or any other metric.

In some embodiments, the measurement system further comprises an external or internal signal generator, such as a signal source. The signal generator is configured to generate a signal based on which the input signal is obtained. Hence, tailored signals can be generated based on which all desired devices which affect the input signal can be characterized. For example, the signal generator can be adapted to generate specific signals according to desired communication standards being of interest, such as 5G, LTE (Long Term Evolution), 6G, or others.

Optionally, the narrowband receiver comprises a synchronizer that is configured to synchronize the signal generator with the signal mixer to establish a fixed phase relationship between the signal generator and the signal mixer. As a consequence, the mixing procedure is easier to apply as the phase condition between the signal generator and the signal mixer is known. Since the phase condition is known, the evaluation of the established processed signal which relies on the captured signals that in turn rely on the mixed signals is simplified as well.

In some embodiments, the signal generator may be part of the narrowband receiver and may be configured so as to establish an internal signal source. Then, the synchronizer can be implemented very efficiently since no devices external to the narrowband receiver are required to be addressed.

In other embodiments, the signal generator is based on a transmitter chip-set configured to provide a respectively generated signal according to the needs.

Consequently, the signal generator may be an internal generator or an external generator, for instance based on a transmitter chip-set.

In some embodiments, the measurement system is calibratable based on the signal generator generating an input signal so as to have a continuous waveform. Put differently, a calibration procedure may be performed based on the signal generator generating an input signal so as to have a continuous waveform. The continuous waveform may guarantee that a known image portions behavior included with the input signal may be established. As a consequence, this known image portions behavior may be used for calibrating the measurement system and, in particular, the narrowband receiver thereof.

In some embodiments, the signal generator is configured to generate the signal in accordance with wideband IQ-sequences. Baseband in-phase and quadrature data (IQ data) are the basis for radio frequency (RF) signal generation as well as RF signal analysis. Therefore, additional aspects of the processed signal may be evaluated.

Optionally, the narrowband receiver is configured to determine an EVM. The EVM is a measure used to quantify the performance of a digital radio transmitter or receiver. In particular, it describes the deviation from the ideal case of the constellation diagram of a signal that is digitally modulated, e.g. by quadrature amplitude modulation, quadrature phase shift keying or phase shift keying.

In some embodiments, the narrowband receiver is configured to modify the center frequency of the local oscillator bandwidth and/or the narrowband receiver comprises two or more signal paths for processing the input signal in parallel. Therefore, the mixed signals may be achieved sequentially, that is, one after the other, or in parallel to each other, that is, simultaneously. For example, by providing multiple signal paths signal processing may be achieved within shorter time. In contrast, by providing only a single signal path, the narrowband receiver may be compact.

In some embodiments, the narrowband receiver comprises a filter located downstream of the signal mixer. Thus, specific portions of the captured signals may be altered as desired.

In some embodiments, the filter has a filter bandwidth. Accordingly, specific portions of the captured signals may be attenuated. For example, those portions may be attenuated which comprise at least part of the image portions.

In certain embodiments, the filter may comprise an anti-alias low-pass filter. That means that frequencies higher than a threshold value of the low-pass filter are attenuated.

As mentioned above, the filter may have a two-sided bandwidth of about 100 to 150 MHz, for instance 125 MHz. Reference is made to the explanations given before with regard to the filter that may be used to obtain the captured signals.

Optionally, the two or more different center frequencies are spaced from each other by an offset that is higher or equal to the half of the filter bandwidth. For example, in case of the filter having a two-sided bandwidth of 125 MHz, the offset spacing between the two or more different center frequencies may be 62.5 MHz or more. In essence, the maximum offset spacing between the two or more center frequencies would be 125 MHz such that no overlap is achieved. This configuration would work for ideal filters with ideal transition between pass- and stop-bands. Lower offset spacings may allow for an overlapping as mentioned before and may require advanced combination techniques such that the overlap can be compensated for. Therefore, initially, the "true" signal, also called input signal portion, as well as the image portions can be obtained for each center frequency-dependent captured signal. Subsequently, the image portions can be compensated for by appropriately determining the "true" signal portions based on, e.g., a least squares method or a Wiener approach.

In some embodiments, the least squares method can be applied to find a matrix enabling a mapping procedure from the processed signal to the measured spectra. After having determined the matrix, the image portions can be compensated for.

In some embodiments, the Wiener approach may be applied to considerer different numbers of measurements of each signal portions, such as in case of multiple signal paths or sequentially performed measurements. Moreover, a noise floor prediction can be achieved.

In some embodiments, the mixed signals each are sectioned into signal sections with a bandwidth (substantially) equal to a difference between the two or more different center frequencies. "Substantially equal" may be regarded that no overlap or only a small overlap between adjacent captured signals is established as described earlier herein. Therefore, a deviation into "true" signal portions, namely input signal portions, and image portions is achieved. This deviation may be considered when processing the captured signals so as to compensate the image portions.

In other embodiments, the mixed signals may each be sectioned into signal sections with a bandwidth smaller than a difference between the two or more different center frequencies. Then, overlapping signal portions are established which may advantageously provide improved signal properties.

Generally, the "true" signal portions, also called input signal portions, relate to the wanted signal, namely the input signal, whereas the image portions relate to the image signal, namely the unwanted signal.

In some embodiments, the narrowband receiver is configured to process the input signal at a number of different center frequencies of the local oscillator signal. Hence, the entire desired bandwidth of the input signal may be covered as to the local oscillator signals having different center frequencies.

In some embodiments, the number of different center frequencies may equal the number of signal sections into which the mixed signals are sectioned. Thus, while covering the bandwidth of interest, the evaluation procedure is optimized as the number of center frequencies is kept as low as possible.

Optionally, the measurement system comprises a device under test (DUT) that outputs the input signal received by the narrowband receiver. Accordingly, the DUT can be characterized with regard to its communication standard-related properties, such as its transfer function, scattering parameters, IQ properties, and EVM.

According to some embodiments, the DUT is a mobile phone, a tablet, a device having a cellular communication module, or a component of any one of these. The measurement system and the method as described herein can thus be applied to a wide variety of different device types.

In other embodiments, the DUT may be a different component to be evaluated with regard to its communication standard-related properties. For example, the DUT may be an electronic component, such as a power amplifier, e.g., of a mobile phone. In this regard, the degradation of the modulation quality (i.e. the error vector magnitude, EVM) caused by the DUT is of central interest for characterizing power amplifiers.

In another embodiment, the measurement of a signal provided by, e.g., a chip-set emitting the input signal received by the narrowband receiver, is of interest. Accordingly, the DUT may also be a transmitter chip-set.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

FIG. 1 is a schematic drawing of a measurement system for eliminating image portions according to an embodiment;

DETAILED DESCRIPTION

Figure 2:
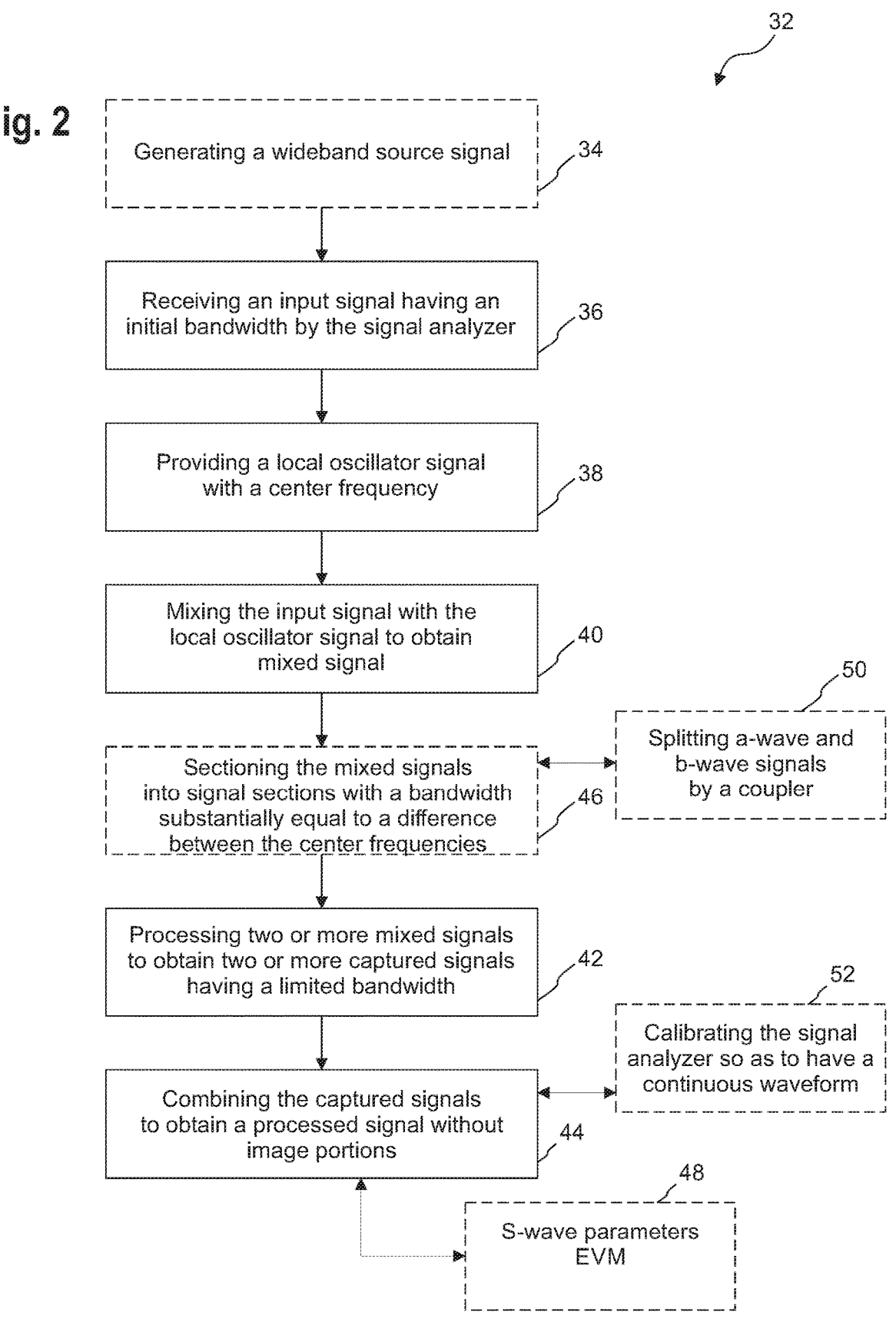
FIG. 2 is a schematic drawing of a method for eliminating image portions according to an embodiment.

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
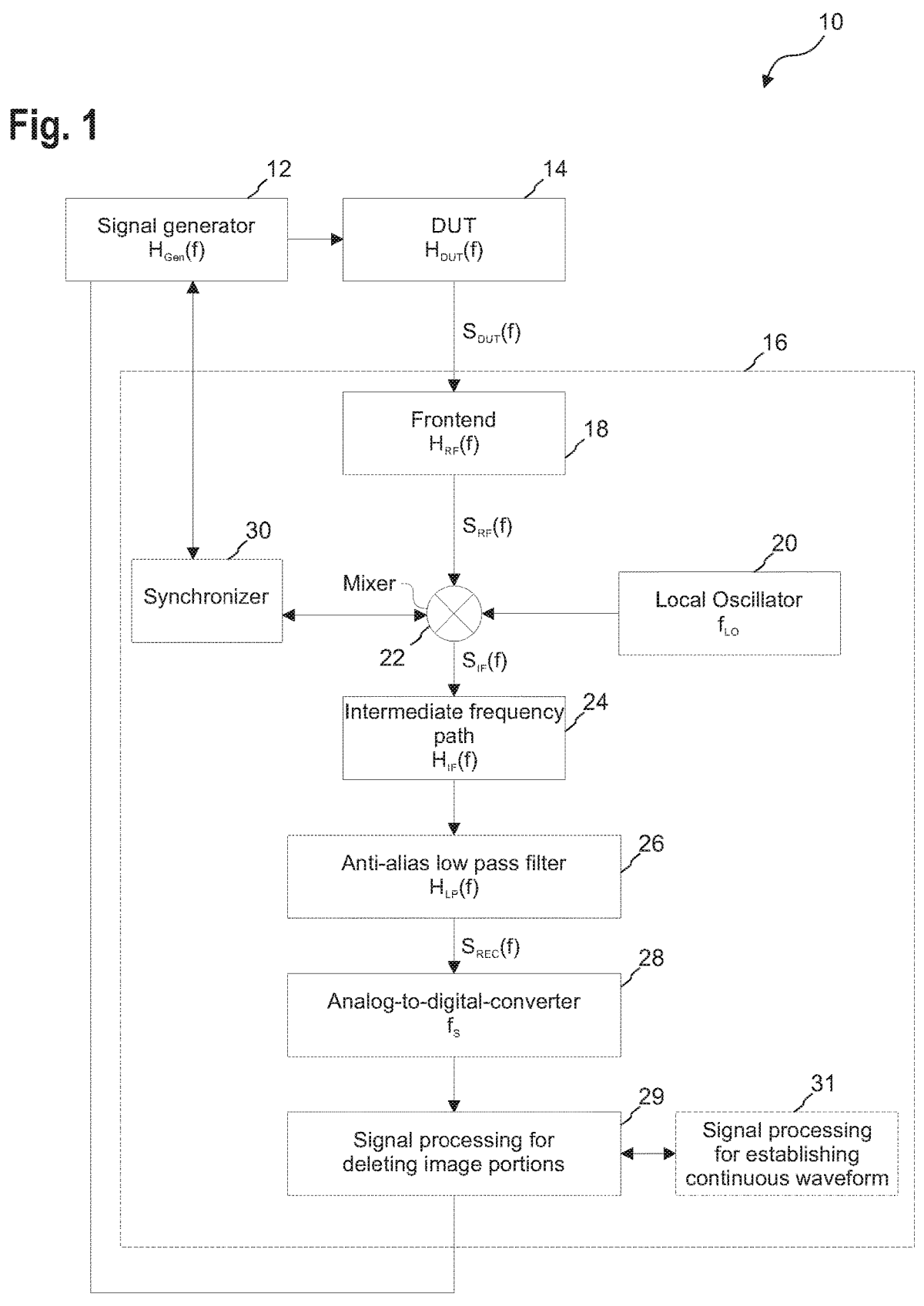

FIG. 1 is a schematic drawing of a measurement system 10 for eliminating image portions according to an embodiment. As shown in the embodiment of FIG. 1, the measurement system 10 comprises an internal or external signal generator 12, a DUT 14 located downstream of the signal generator 12, and a narrowband receiver 16 without image rejection capabilities, located downstream of the DUT 14.

The signal generator 12 is configured to generate a signal for evaluating the communication related parameters of the DUT 14. In some embodiments, the signal generator 12 is configured to generate signals having different waveforms. The signal generator 12 has a frequency response mismatch. Therefore, the signal generator is characterized by its intrinsic transfer function $H_{Gen}(f)$.

The signals generated by the signal generator 12 are usually within the radio frequency (RF) domain, i.e. above 1 MHz. The signal generator 12 may be part of the narrowband receiver 16 itself or an external signal generator, e.g. based on a transmitter chip-set.

In some embodiments, the signal waveforms may correlate with certain communication standards, such as 5G, LTE, or 6G. Put differently, the signals generated by the signal generator 12 may correspond to a single or multiple specific bandwidths associated with a single or multiple communication standards being of interest. Usually, at a time the DUT 14 is inspected only with regard to a single communication standard.

The DUT 14 interacts with the signal generated by the signal generator 12. This interaction is described by a respective transfer function of the DUT 14, i.e. $H_{DUT}(f)$. As a consequence, the signal initially generated by the signal generator 12 downstream of the DUT 14 is altered due to the interaction with the DUT 14. The interaction between the DUT 14 and the signal generated by the signal generator 12 is frequency-dependent.

The interaction with the DUT 14 also causes frequency-dependent scattering of the transmitted signal to occur. The scattering actions are described by the scattering parameters assigned to the DUT 14. Specific aspects of the scattering procedures may also be described in terms of additional parameters, such as a-wave and b-wave scattering parameters, EVM, and IQ-properties. Based on these parameters, the DUT 14 may be precisely characterized in view of its RF dependent properties. Put differently, for precisely characterizing the communication properties of the DUT 14, the general aim of the measurement system 10 is to evaluate and determine the DUTs 14 transfer function and scattering parameters.

The frequency dependent signal outputted by the DUT 14 is designated by $S_{DUT}(f)$. This signal is forwarded to the narrowband receiver 16 as an input signal. The narrowband receiver 16 omits (i.e., does not comprise or include) any intrinsic image portion rejection capabilities.

The narrowband receiver 16 comprises a frontend 18, which receives the input signal downstream of the DUT 14, e.g. a signal based on the frequency dependent signal outputted by the DUT 14, namely $S_{DUT}(f)$. In some embodiments, the input signal (also) depends on the interaction of the DUT 14 with the signal generated by the signal generator 12.

The frontend 18 is characterized by a respective transfer function $H_{RF}(f)$. Naturally, the frontend 18 causes additional effects to occur. These may cause an altered radio frequency signal denoted by $S_{RF}(f)$ that is based on the input signal.

In some embodiments, the narrowband receiver 16 comprises a local oscillator 20 configured to generate a local oscillator signal having a specific local oscillator frequency $f_{LO}$. The local oscillator frequency $f_{LO}$ is also called center frequency of the local oscillator 20.

In some embodiments, the narrowband receiver 16 may also comprise a mixer 22. The mixer 22 is configured to mix the local oscillator signal and the signal received from the frontend 18. As a consequence of the mixing procedure, a mixed signal is obtained which has a respective center frequency determined by the center frequency of the local oscillator 20.

The mixing procedure provides a mixed signal $S_{IF}(f)$. Here, "IF" describes the intermediate frequency obtained after mixing the radio frequency (RF) signal with the local oscillator signal. Accordingly, downstream of the mixer 22 an intermediate frequency path 24 is established within the narrowband receiver 16 whose transfer function describing the corresponding interaction with the signal received is denoted by $H_{IF}(f)$.

In some embodiments, the narrowband receiver 16 further comprises a (low-pass) filter 26, for example an anti-alias low-pass filter. The filter 26 also interacts with the signal received, wherein the respective transfer function is denoted by $H_{LP}(f)$. The filter 26 also causes additional effects to occur, wherein the signal outputted by the filter is denoted by $S_{REC}(f)$. This signal may be also called a captured signal which has a limited bandwidth compared to the initial bandwidth of the input signal, for example due to the filter 26 applied.

Downstream of the filter 26 an analog-to-digital converter 28 of the narrowband receiver 16 is located. The analog-to-digital converter 28 is configured to output a digitized signal for further evaluation or processing.

According to block 29, the signal outputted by the analog-to-digital converter 28 is processed so as to delete or compensate for image portions as will be described in greater detail with reference to the following FIGURES. Put differently, block 29 of the narrowband receiver 16 is configured to evaluate and to process the digitized signal.

Optionally, at block 31, the signal may be processed further such that a continuous waveform is achieved. Thereby, a known image portions behavior included with the input signal may be established. As a consequence, the known image portions behavior may be used for calibrating the measurement system 10 and, for example, the narrowband receiver 16 thereof.

In some embodiments, blocks 29 and 31 could also be part of the signal generator 12.

In certain embodiments, the signal outputted by the analog-to-digital converter 28 and evaluated at block 29 may be fed back to the signal generator 12 for establishing a closed loop.

In some embodiments, at least the analog-to-digital converter 28 may also be external of the narrowband receiver 16.

In certain embodiments, multiple signal paths may be established in parallel to each other. Each signal path may then comprise at least a mixer 22, an intermediate frequency path 24, and a filter 26, e.g. a two-sided anti-alias low-pass filter. Using multiple signal paths, the same input signal may be processed simultaneously with regard to different sections or portions in parallel.

In some embodiments, the narrowband receiver 16 also comprises a synchronizer 30. The synchronizer 30 is configured to synchronize the mixer 22 with the signal generator 12. This means that a fixed phase relationship is guaranteed between the mixer 22 and the signal generator 12. Thereby, the evaluation procedure is simplified.

Of course, in some embodiments, the narrowband receiver 16 may also comprise additional components, such as a digital signaling processor circuit and a data processing circuit. These components may be used to evaluate specific aspects of the signal transmitted through the narrowband receiver 16 at different stages thereof.

In some embodiments, the narrowband receiver 16 may be configured for direct sampling of the processed signal using the proposed approach to compensate residual image portions which may occur based on IQ imbalances.

In principle, the signal processed by the intermediate frequency path 24 of the narrowband receiver 16 comprises image portions, namely due to the mixing. In other words, the narrowband receiver 16 does not comprise intrinsic image portion rejection (compensating) techniques. However, as will be described in more detail in view of the following FIGURES, these image portions can be compensated for when applying specific processing routines.

In some embodiments, the signal generator 12 is at least configured to generate a signal so as to have a continuous waveform. Based on the continuous waveform, a known image portions behavior may be achieved in view of the interaction caused by the DUT 14. As a consequence, the narrowband receiver 16 may be calibratable based on the signal having a continuous waveform. In this regard, the known image portions behavior can be compared to the procedure performed by the narrowband receiver 16. If correspondence is achieved, the narrowband receiver 16 is respectively calibrated.

FIG. 2 is a schematic drawing of a method 32 for eliminating image portions according to an embodiment. Optional steps are shown in dashed lines.

The method 32 comprises the optional step 34 according to which a signal is generated by the signal generator 12 in accordance with wideband IQ-sequences. Therefore, the DUT 14 can be evaluated with regard to RF characteristics, such as according to specific communication standard related signals, e.g. 5G.

Subsequently, the method 32 comprises the step 36, according to which an input signal, e.g. $S_{DUT}(f)$, with an initial bandwidth is received by the narrowband receiver 16. Initially, the input signal is received by the frontend 18 of the narrowband receiver 16.

The method 32 continues to step 38, in which a local oscillator signal with a center frequency $f_{LO}$ is provided by at least one local oscillator 20 of the narrowband receiver 16. Generally, the center frequency $f_{LO}$ can be adapted.

Then, in step 40 of method 32 the mixer 22 of the narrowband receiver 16 is used to mix the input signal and the local oscillator signal such that a mixed signal is obtained, e.g. $S_{IF}(f)$. The mixed signal generally includes image portions due to the mixing procedure. The mixed signal has a respective center frequency in view of the local oscillator signal which is included therein. In other words, the mixed signal is symmetric about the center frequency. The image portion occurs at (imaginary) negative frequencies centered about the negative center frequency in view of the center frequency of the local oscillator signal.

Figure 3:
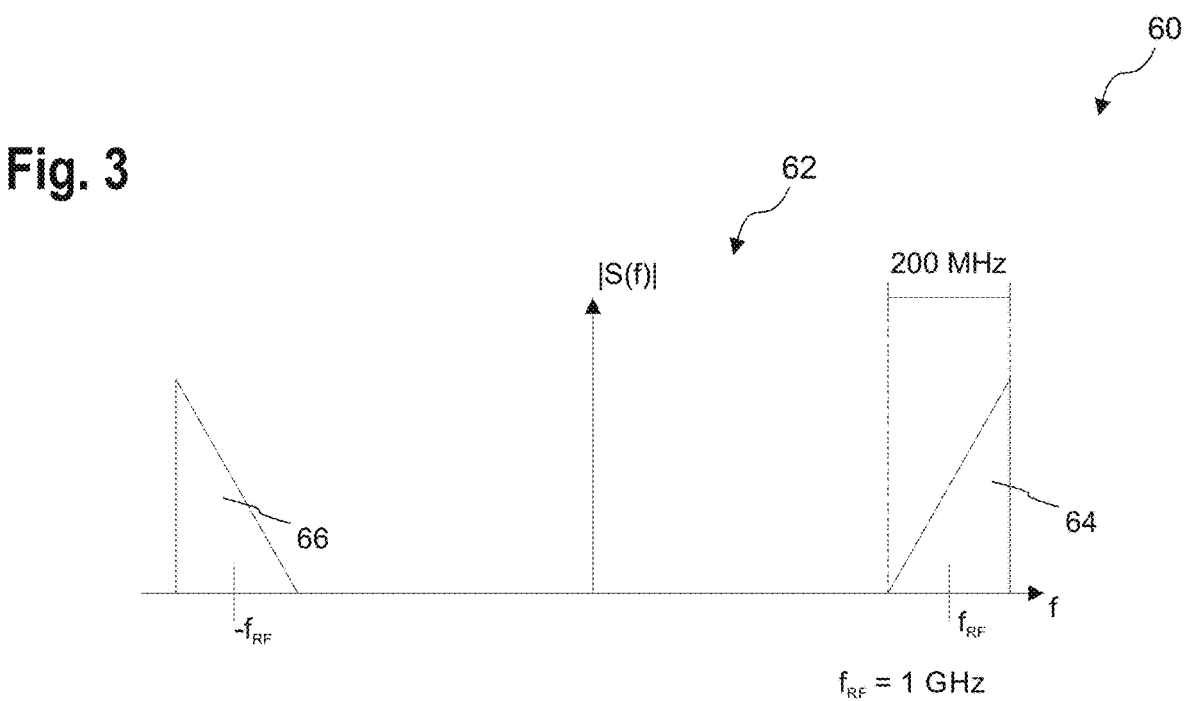
FIG. 3 is a schematic drawing of signal portions within the context of the method for eliminating image portions according to an embodiment.
Figure 3:
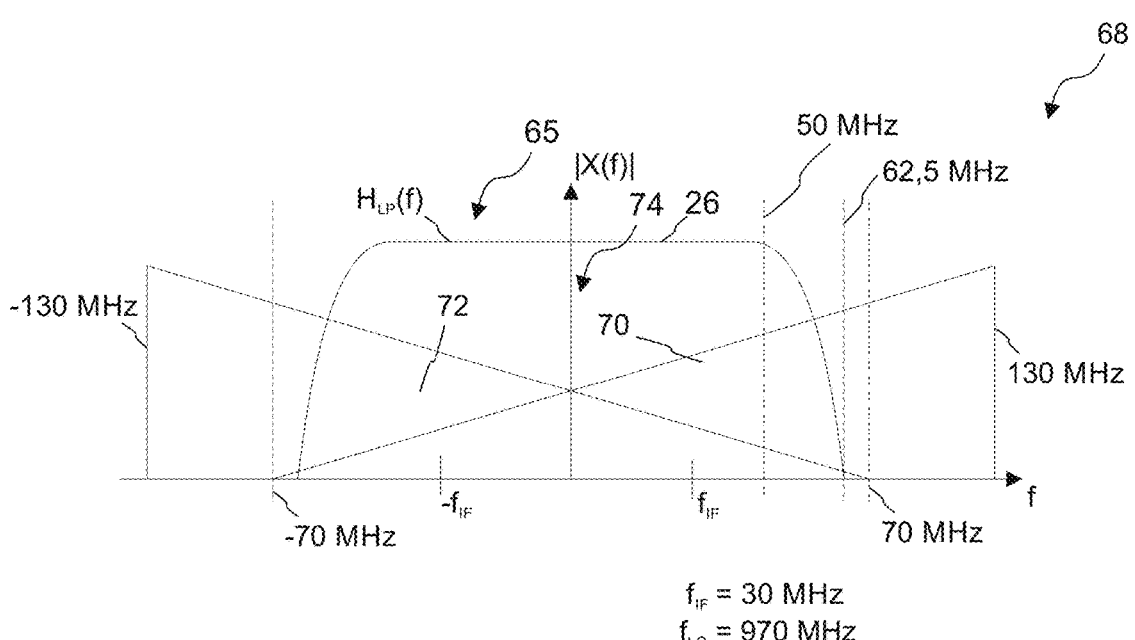

In this regard, FIG. 3 is a schematic drawing 60 of signal portions within the context of the method 32 for eliminating image portions according to an embodiment. The schematic drawing 60 shows the absolute value of the RF signal in the frequency domain |S(f)| on the y-axis depending on the frequency depicted on the x-axis.

As shown in FIG. 3, the signal 62 comprises an input signal portion 64 and its image portion 66. According to this illustrative example, the input signal portion 64 comprises a bandwidth of 200 MHz, e.g. similar to the input signal. Due to the limited bandwidth of the narrowband receiver 16, the bandwidth of 200 MHz cannot be investigated using a single-shot measurement.

As shown, the input signal portion 64 is centered about the RF center frequency $f_{RF}$=1 GHz. Consequently, the image portion 66 is centered about the negative RF center frequency, namely $-f_{RF}$=-1 GHz.

When mixing the input signal by the local oscillator signal, a mixed signal 65 is obtained which comprises a mixed input signal portion 70 and a mixed image portion 72 as shown in the schematic drawing 68 of FIG. 3.

In the shown embodiment, the local oscillator 20 has a center frequency of $f_{LO}$=970 MHz. Based on the center frequency of the local oscillator 20, the center frequency of the mixed input signal portion 70, e.g. the one obtained when mixing the input signal portion 64, matches the intermediate frequency $f_{IF}$. The mixed image portion 72, e.g. the one obtained when mixing the image portion 66, matches the negative intermediate frequency-fir, as also shown in the schematic drawing 68 of FIG. 3.

Consequently, the mixed input signal portion 70 ranges from -70 MHz to 130 MHz, whereas the mixed image portion 72 ranges from -130 MHz to 70 MHz.

In this regard, the schematic drawing 68 of FIG. 3 also shows the signal when applying the filter 26 in view of the (mixed) input signal portion 64 and the (mixed) image portion 66. In some embodiments, a portion associated with a bandwidth of 100 MHz is filtered, namely from -50 MHz to 50 MHz. This portion relates to a captured signal 74 having a limited bandwidth compared to the initial bandwidth of 200 MHz.

Alternatively, a filter bandwidth of 90 MHz or a filter bandwidth between 90 and 100 MHz may be applied.

As shown in the schematic drawing 68 of FIG. 3, the captured signal 74, e.g. the one processed by the filter 26, comprises the mixed input signal portion 70 and the mixed image portion 72.

The method 32 also comprises the step 42 according to which two or more mixed signals 65 are processed by the narrowband receiver 16. Thereby, two or more captured signals 74 are obtained for different center frequencies of the local oscillator signal. The two or more captured signals 74 have a limited bandwidth compared to the initial bandwidth.

Put differently, different center frequencies of the local oscillator 20 are applied so as to establish different mixed signals 65. This is performed for investigating different portions of the mixed signal 65 as the bandwidth of the narrowband receiver 16 is insufficient to investigate the initial bandwidth of the input signal using a single processing procedure. This will be described hereinafter by reference to FIG. 4.

As mentioned above, the anti-alias low-pass filter 26 comprises a pass-band edge of 50 MHz relative to the center frequency, here denoted as 0 MHz. At 62.5 MHz the attenuation by the low-pass filter 26 is so strong that no significant signal amplitudes are transmitted anymore.

As a consequence of applying the low-pass filter 26, based on the input signal the mixed input signal portion 70 associated with the input signal portion 64 is obtained. Moreover, also the mixed image portion 72 associated with the image portion 66 is obtained at the same time, as discussed above.

By modifying the center frequency of the local oscillator 20, respective different portions or sections of the mixed input signal portion 70 and the mixed image portion 72 can then be placed into the bandwidth of the filter 26. Put differently, based on modifying the center frequency of the local oscillator 20, different captured signals 74 are established, as shown in FIG. 4.

Figure 4:
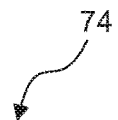
FIG. 4 is a schematic drawing of several different captured signals within the context of the method for eliminating image portions according to an embodiment.

In this regard, FIG. 4 is a schematic drawing of several different captured signals 74 within the context of the method 32 for eliminating image portions 66 according to an embodiment. Here, three different captured signals 74 are shown, where the center frequency of the local oscillator 20 is modified to match 900 MHZ, 950 MHz, and 1000 MHz. For the sake of completeness, to investigate the illustrative example of the bandwidth of 200 MHz, additional captured signal 74 are contemplated for the additional set of frequencies of 1050 MHz and 1100 MHz of the local oscillator 20 (not shown here).

To cover the entire bandwidth of 200 MHz, five different center frequencies of the local oscillator 20 are required to identify different contributions of the input signal portion 64 and the image portion 66. Put differently, when modifying the center frequency of the local oscillator 20 the correspondingly captured signals 74 are offset with respect to each other in view of the shifting of the center frequency.

For the center frequency of $f_{LO}$=900 MHZ, when applying the low-pass filter 26, a first portion $R_{900}$ of the captured signal 74 is caused by a section of the mixed input signal portion 70. This first section is denoted as B1. A second portion $L_{900}$ is caused by a first section of the mixed image portion 72. This first section is denoted as −B1. Here, B1, −B1, B2, −B2, and so forth denote the sections of the measured spectra based on the captured signals 74.

When shifting the center frequency of the local oscillator 20, different respective sections of the mixed input signal portion 70 and the mixed image portion 72 are included within the captured signals 74.

Accordingly, for a center frequency of $f_{LO}$=950 MHZ, a first portion $R_{950}$ of the captured signal 74 for this center frequency is caused by a second section of the mixed input signal portion 70, which is denoted as B2, and the first section of the mixed image portion 72, namely −B1. A second portion $L_{950}$ of the captured signal 74 for this center frequency is caused by a second section of the mixed image portion 72, also denoted as −B2, and the first section of the mixed input signal portion 70, namely B1.

When shifting the center frequency of the local oscillator 20 even further, for a center frequency of $f_{LO}$=1000 MHZ, a first portion $R_{1000}$ of the captured signal 74 for this center frequency is caused by a third section of the input signal portion 64, also denoted as B3, and the second section of the mixed image portion 72, namely −B2. A second portion $L_{1000}$ of the captured signal 74 for this center frequency is caused by a third section of the image portion 66, also denoted as −B3, and the second section of the mixed input signal portion 70, namely B2.

As can be seen in view of captured signals 74 corresponding to different center frequencies of the local oscillator 20, the respective sections of the mixed input signal portion 70 and the mixed image portion 72 represent superposed partial sections. As a consequence, a correlation exists between the different captured signals 74 when altering the center frequency of the local oscillator 20.

Figure 5:
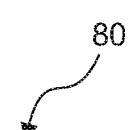
FIG. 5 is a schematic drawing of aspects of the method for eliminating image portions according to an embodiment.
Figure 5:

In this regard, FIG. 5 is a schematic drawing of aspects of the method 32 for eliminating image portions 66 according to an embodiment.

As to the correlation, a vector 80 can be determined which describes the contributions of the different signal portions to respective portions of the captured signals 74 when altering the center frequency of the local oscillator 20. For example, the portion $R_{950}$, i.e. the portion assigned to the input signal portion 64 for a center frequency of 950 MHZ, can be determined by summing the partial contributions −B1 and B2. The partial contributions −B1, B2, and others, so as B3, −B3, and so forth may be acquired through the captured signals 74 when appropriately adapting the center frequency of the local oscillator 20.

Moreover, based on these considerations, a matrix may be determined which describes a mapping procedure 82 of the different contributions, i.e. $R_{900}$, $L_{900}$, and so forth of the captured signals 74 in view of the parts of the measured spectra, i.e. B1, −B1, B2, −B2, and so forth. For example, the matrix may be determined based on a least squares method or a Wiener approach.

Accordingly, the method 32 establishes a mapping procedure 82 based on which the image portion 66 may be precisely determined although the bandwidth of the narrowband receiver 16 is smaller than the initial bandwidth of the input signal. In this regard, the narrowband receiver 16 is not required to comprise any intrinsic image portion rejection (compensation) techniques. As a consequence, the image portion 66 can be omitted when further processing the captured signals 74. Put differently, the image portion 66 can be compensated for.

Subsequently, the method 32 comprises the step 44 of combining the two or more captured signals 74 in order to obtain a processed signal without image portions 66.

In some embodiments, when modifying the center frequency of the local oscillator 20, the center frequency may be adapted such that an overlap between different captured signal 74 is prevented. As a consequence, the evaluation procedure is simplified since no overlapping portions are required to be contemplated when determining the mapping procedure 82.

In some embodiments, the method 32 may further comprise the optional step 46 according to which the mixed signals 62 each are sectioned into signal sections with a bandwidth (substantially) equal to a difference between the two or more different center frequencies of the local oscillator 20. "Substantially equal" may be regarded that none or only a small overlap between adjacent captured signals 74 is established as described earlier herein. This sectioning mechanism is depicted in FIG. 4 in view of the different parts of the measured spectra, as discussed before. For simplicity reasons, overlapping portions of the captured signals 74 are omitted within the FIGURES.

According to optional step 48 of method 32, specific parameters describing the communication standard related properties of the DUT 14 may be determined. For example, the scattering parameters S12 and S21 may be determined. Also, the EVM of the DUT 14 may be determined. In this regard, the signal generator 12 may be configured to generate the signal according to a wideband IQ-sequence (in-phase and quadrature).

In some embodiments, the method 32 may also comprise the optional step 50. According to this step 50, the narrowband receiver 16 comprises a coupler which is configured to split an a-wave signal propagating in a first direction and a b-wave signal propagating in a second direction. The second direction is opposite to the first direction.

For example, the a-wave may correspond to forward propagating direction while the b-wave may correspond to a backward propagating direction of the signal. The DUT 14 may then be characterized with regard to its transfer function and scattering parameters e.g. $S_{12}$ and $S_{21}$ as well as EVM and IQ-parameters for signals propagating according to both propagating directions. Hence, the DUT 14 can be characterized with regard to additional aspects.

In some embodiments, the method 32 may also comprise the optional step 52 in that the narrowband receiver 16 is calibratable based on the signal generator 12 generating the input signal so as to have a continuous waveform. Based on the continuous waveform a known image portion 66 behavior may be established. Therefore, it can be reviewed whether the method 32 is appropriately compensating the image portions 66. If that is not the case, the method 32, and in particular the mapping procedure 82 may be altered.

Based on this calibration procedure, the narrowband receiver 14 may also be adapted such that additional contributions caused by the transfer functions of the signal generator 12, the frontend 18, the initial frequency path 24, and the anti-alias low-pass filter 26 may be compensated for. As a consequence, a de-embedded signal may be achieved usable for precisely investigating the DUT 14.

Certain embodiments disclosed herein include systems, apparatus, modules, components, etc., such as the signal generator 12, the DUT 14, the narrowband receiver 16, etc., that utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

For example, the functionality described herein can be implemented by special purpose hardware-based computer systems or circuits, etc., or combinations of special purpose hardware and computer instructions. Each of these special purpose hardware-based computer systems or circuits, etc., or combinations of special purpose hardware circuits and computer instructions form specifically configured circuits, machines, apparatus, devices, etc., capable of implemented the functionality described herein.

Of course, in some embodiments, two or more of these components, or parts thereof, can be integrated or share hardware and/or software, circuitry, etc. In some embodiments, these components, or parts thereof, may be grouped in a single location or distributed over a wide area. In circumstances where the components are distributed, the components are accessible to each other via communication links.

In some embodiments, one or more of the components, such as the signal generator 12, the DUT 14, the narrowband receiver 16, etc., referenced above include circuitry programmed to carry out one or more steps of any of the methods disclosed herein. In some embodiments, one or more computer-readable media associated with or accessible by such circuitry contains computer readable instructions embodied thereon that, when executed by such circuitry, cause the component or circuitry to perform one or more steps of any of the methods disclosed herein.

In some embodiments, the computer readable instructions includes applications, programs, program modules, scripts, source code, program code, object code, byte code, compiled code, interpreted code, machine code, executable instructions, and/or the like (also referred to herein as executable instructions, instructions for execution, program code, computer program instructions, and/or similar terms used herein interchangeably).

In some embodiments, computer-readable media is any medium that stores computer readable instructions, or other information non-transitorily and is directly or indirectly accessible to a computing device, such as processor circuitry, etc., or other circuitry disclosed herein etc. In other words, a computer-readable medium is a non-transitory memory at which one or more computing devices can access instructions, codes, data, or other information. As a non-limiting example, a computer-readable medium may include a volatile random access memory (RAM), a persistent data store such as a hard disk drive or a solid-state drive, or a combination thereof. In some embodiments, memory can be integrated with a processor, separate from a processor, or external to a computing system.

Accordingly, blocks of the block diagrams and/or flowchart illustrations support various combinations for performing the specified functions, combinations of operations for performing the specified functions and program instructions for performing the specified functions. These computer program instructions may be loaded onto one or more computer or computing devices, such as special purpose computer(s) or computing device(s) or other programmable data processing apparatus(es) to produce a specifically-configured machine, such that the instructions which execute on one or more computer or computing devices or other programmable data processing apparatus implement the functions specified in the flowchart block or blocks and/or carry out the methods described herein. Again, it should also be understood that each block of the block diagrams and flowchart illustrations, and combinations of blocks in the block diagrams and/or flowchart illustrations, or portions thereof, could be implemented by special purpose hardware-based computer systems or circuits, etc., that perform the specified functions or operations, or combinations of special purpose hardware and computer instructions.

In the foregoing description, specific details are set forth to provide a thorough understanding of representative embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure. Further, it will be appreciated that embodiments of the present disclosure may employ any combination of features described herein. All such combinations or sub-combinations of features are within the scope of the present disclosure.

Although the method and various embodiments thereof have been described as performing sequential steps, the claimed subject matter is not intended to be so limited. As nonlimiting examples, the described steps need not be performed in the described sequence and/or not all steps are required to perform the method. Moreover, embodiments are contemplated in which various steps are performed in parallel, in series, and/or a combination thereof. As such, one of ordinary skill will appreciate that such examples are within the scope of the claimed embodiments.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near,"

etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

Throughout this specification, terms of art may be used. These terms are to take on their ordinary meaning in the art from which they come, unless specifically defined herein or the context of their use would clearly suggest otherwise.

The drawings in the FIGURES are not to scale. Similar elements are generally denoted by similar references in the FIGURES. For the purposes of this disclosure, the same or similar elements may bear the same references. Furthermore, the presence of reference numbers or letters in the drawings cannot be considered limiting, even when such numbers or letters are indicated in the claims.

Systems, methods and apparatus are provided herein. In the detailed description herein, references to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The invention claimed is:

1. A measurement system for eliminating image portions, the measurement system comprising:
a narrowband receiver configured to receive an input signal with an initial bandwidth, wherein the narrowband receiver comprises
at least one local oscillator configured to provide a local oscillator signal having a center frequency, and
at least one signal mixer configured to mix the input signal and the local oscillator signal to obtain a mixed signal including image portions, wherein the mixed signal has a respective center frequency in view of the local oscillator signal mixed therein,
wherein the narrowband receiver is configured to modify the center frequency of the local oscillator bandwidth and/or wherein the narrowband receiver comprises two or more signal paths for processing the input signal in parallel, wherein the narrowband receiver is configured to process two or more mixed signals, thereby obtaining two or more captured signals for different center frequencies of the local oscillator signal, wherein the captured signals have a limited bandwidth compared to the initial bandwidth, and
wherein the narrowband receiver is configured to combine the two or more captured signals in order to obtain a processed signal without image portions.

2. The measurement system according to claim 1, wherein the narrowband receiver is configured to adapt the center frequency of the local oscillator signal such that an overlap between different captured signals is prevented, such that an overlap between different captured signals is provided, or such that a gap between different captured signals is provided.

3. The measurement system according to claim 1, wherein the captured signals are offset with respect to each other based on the respectively associated center frequencies of the local oscillator signal.

4. The measurement system according to claim 1, wherein the narrowband receiver comprises a coupler configured to split an a-wave signal propagating in a first direction and a b-wave signal propagating in a second direction, the second direction being opposite to the first direction.

5. The measurement system according to claim 1, wherein the narrowband receiver is configured to determine at least one scattering parameter associated with the processed signal.

6. The measurement system according to claim 1, wherein the measurement system comprises a signal generator configured to generate a signal based on which the input signal is obtained, and wherein the narrowband receiver comprises a synchronizer that is configured to synchronize the signal generator with the signal mixer to establish a fixed phase relationship between the signal generator and the signal mixer, wherein the signal generator is external or internal to the narrowband receiver.

7. The measurement system according to claim 6, wherein the measurement system is calibratable based on the signal generator generating the input signal so as to have a continuous waveform.

8. The measurement system according to claim 6, wherein the signal generator is configured to generate the signal in accordance with wideband IQ-sequences, and wherein the narrowband receiver is configured to determine an error vector magnitude.

9. The measurement system according to claim 1, wherein the narrowband receiver comprises a filter located downstream of the signal mixer, wherein the filter has a filter bandwidth, and wherein the two or more different center frequencies are spaced from each other by an offset that is higher or equal to the half of the filter bandwidth.

10. The measurement system according to claim 1, wherein the mixed signals each are sectioned into signal sections with a bandwidth substantially equal to or less than a difference between the two or more different center frequencies.

11. The measurement system according to claim 10, wherein the narrowband receiver is configured to process the input signal at a number of different center frequencies of the local oscillator signal, which equals the number of signal sections into which the mixed signals are sectioned.

12. The measurement system according to claim 1, wherein the measurement system comprises a device under test that outputs the input signal received by the narrowband receiver.

13. A method for eliminating image portions, the method comprising the steps of:

receiving an input signal with an initial bandwidth by a narrowband receiver;

providing a local oscillator signal with a center frequency by at least one local oscillator of the narrowband receiver;

mixing, by at least one mixer of the narrowband receiver, the input signal and the local oscillator signal to obtain a mixed signal including image portions, wherein the mixed signal has a respective center frequency in view of the local oscillator signal mixed therein;

processing, by the narrowband receiver, two or more mixed signals, thereby obtaining two or more captured signals for different center frequencies of the local oscillator signal, wherein the mixed signals each are sectioned into signal sections with a bandwidth substantially equal to or less than a difference between the two or more different center frequencies, wherein the two or more captured signals have a limited bandwidth compared to the initial bandwidth; and combining the two or more captured signals in order to obtain a processed signal without image portions.

14. The method of claim 13, wherein the center frequency of the local oscillator signal is adapted such that an overlap between different captured signals is prevented, such that an overlap between different captured signals is provided, or such that a gap between different captured signals is provided.

15. The method of claim 13, wherein the captured signals are offset with respect to each other based on the respectively associated center frequencies of the local oscillator signal.

16. The method of claim 13, wherein an a-wave signal propagating in a first direction and a b-wave signal propagating in a second direction are split by a coupler of the narrowband receiver, the second direction being opposite to the first direction.

17. The method of claim 13, wherein a calibration procedure is performed based on the narrowband receiver generating a signal based on which the input signal is obtained so as to have a continuous waveform.

18. The method of claim 13, wherein the input signal is processed at a number of different center frequencies of the local oscillator signal, which equals the number of signal sections into which the mixed signals are sectioned.

19. A measurement system for eliminating image portions, the measurement system comprising:

a narrowband receiver configured to receive an input signal with an initial bandwidth, wherein the narrowband receiver comprises at least one local oscillator configured to provide a local oscillator signal having a center frequency, and at least one signal mixer configured to mix the input signal and the local oscillator signal to obtain a mixed signal including image portions, wherein the mixed signal has a respective center frequency in view of the local oscillator signal mixed therein, wherein the narrowband receiver is configured to process two or more mixed signals, thereby obtaining two or more captured signals for different center frequencies of the local oscillator signal, wherein the captured signals have a limited bandwidth compared to the initial bandwidth, wherein the narrowband receiver is configured to combine the two or more captured signals in order to obtain a processed signal without image portions, and wherein the narrowband receiver is configured to determine at least one scattering parameter associated with the processed signal.

* * * * *